(12) United States Patent
Shin et al.

(10) Patent No.: US 7,610,574 B2
(45) Date of Patent: Oct. 27, 2009

(54) METHOD AND APPARATUS FOR DESIGNING FINE PATTERN

(75) Inventors: Jae-pil Shin, Suwon-si (KR); Young-ile Kim, Yongin-si (KR); Moon-hyun Yoo, Suwon-si (KR); Jong-bae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 407 days.

(21) Appl. No.: 11/590,399

(22) Filed: Oct. 31, 2006

(65) Prior Publication Data
US 2008/0082954 A1 Apr. 3, 2008

(30) Foreign Application Priority Data
Oct. 2, 2006 (KR) .................. 10-2006-0097409

(51) Int. Cl.
*G06F 17/50* (2006.01)
(52) U.S. Cl. .................. 716/21; 716/7; 716/19
(58) Field of Classification Search .............. 716/7, 716/19, 21
See application file for complete search history.

(56) References Cited
U.S. PATENT DOCUMENTS
5,329,333 A * 7/1994 Noguchi et al. ............... 355/53
6,016,187 A * 1/2000 Noguchi et al. ............... 355/53
6,603,688 B2 8/2003 Hasegawa et al.
2006/0039596 A1* 2/2006 Nojima et al. ............... 382/144
2006/0234166 A1 10/2006 Lee et al.

FOREIGN PATENT DOCUMENTS
| JP | 06-037138 | 2/1994 |
| KR | 1999-0055114 | 7/1999 |
| KR | 10-2004-0073312 A | 8/2004 |
| KR | 10-2006-0110097 | 10/2006 |

* cited by examiner

*Primary Examiner*—Sun J Lin
(74) *Attorney, Agent, or Firm*—Mills & Onello, LLP (57) ABSTRACT

Provided are a method and apparatus for designing a fine pattern that can be entirely transferred onto an object. The method includes reading the original data of a fine pattern for exposure. The fine pattern is divided into a first pattern not requiring revision and a second pattern requiring revision. The fine pattern is revised by forming an auxiliary pattern maintaining a first distance D1 from the second pattern. A fine pattern to be transferred onto a target object is estimated by running an emulation program including a first auxiliary pattern and a second auxiliary pattern. The estimated fine pattern is compared to the original data of the fine pattern for exposure, and the revised fine pattern is designated as a final fine pattern if there is no difference between the estimated fine pattern and the original data of the fine pattern for exposure.

19 Claims, 7 Drawing Sheets

METHOD AND APPARATUS FOR DESIGNING FINE PATTERN

CROSS-REFERENCE TO RELATED PATENT APPLICATION

This application claims the benefit of Korean Patent Application No. 10-2006-0097409, filed on Oct. 2, 2006, in the Korean Intellectual Property Office, the contents of which are incorporated herein in their entirety by reference.

BACKGROUND OF THE INVENTION

1. Field of the Invention

The present invention relates to a method and apparatus for designing a fine pattern, and more particularly, to a method and apparatus for designing a fine pattern for exposure on a substrate using a program.

2. Description of the Related Art

Due to a recent trend toward higher integration of semiconductor devices, patterns for forming semiconductor devices are gradually becoming finer. As the size of individual devices including fine patterns is being reduced, the pitch, that is, the width and interval, of a desired pattern must also be reduced. However, photolithography that is used to form patterns, for example a line and space pattern (hereinafter called "line pattern"), required to form a semiconductor device, has resolution limits so that there are limitations in forming fine patterns.

Fine patterns can be employed in a variety of ways in the production of semiconductor devices, among which is a method of forming spacers of a small size disclosed in U.S. Pat. No. 6,603,688, which is hereby incorporated by reference, and a self-align method disclosed in Korean Patent Application No. 2005-0032297, which is hereby incorporated by reference. The patterns on a mask for transferring fine patterns must actually be transferred onto an object. However, a design method and apparatus for designing an exposure pattern that transfers a fine pattern in its entirety do not yet exist.

SUMMARY OF THE INVENTION

The present invention provides a method of designing a fine pattern that can be entirely transferred onto an object.

The present invention also provides an apparatus for performing the above designing method.

According to an aspect of the present invention, there is provided a method for designing a fine pattern to be entirely transferred onto an object. The method includes reading the original data of a fine pattern for exposure. The fine pattern is divided into a first pattern not requiring revision and a second pattern requiring revision. The fine pattern is corrected by forming an auxiliary pattern so as to maintain a first distance D1 from the second pattern. The fine pattern to be transferred onto a target object is estimated by running an emulation program including a first auxiliary pattern and a second auxiliary pattern. The estimated fine pattern is compared to the original data of the fine pattern for exposure, and the revised fine pattern is designated as a final fine pattern if there is no difference between the estimated fine pattern and the original data of the fine pattern for exposure.

In one embodiment, dividing the fine pattern comprises: selecting from a plurality of multi-angled fine patterns a selected multi-angled fine pattern to be divided into the first and second patterns; determining a connecting portion for dividing the selected multi-angled fine pattern into quadrangular shapes; and obtaining the divided first and second patterns by removing the connecting portion.

After dividing the fine pattern, a determination is made as to whether the dividing of the fine pattern into the first and second patterns has been properly performed. A multi-angled fine pattern to be divided into the first and second patterns is reselected if the dividing of the fine pattern into the first and second patterns has not been improperly performed.

In one embodiment, the method further comprises, after dividing of the fine pattern into the first and second patterns: checking whether the dividing of the fine pattern into the first and second patterns has been properly performed; and reattaching the connecting portion if the dividing has been properly performed.

In one embodiment, the method further comprises, after dividing the first and second patterns: determining whether the first and second patterns can be formed through photo etching; and reselecting a multi-angled fine pattern to be divided into the first and second patterns if it is determined that the first and second patterns cannot be formed through photo etching.

In the forming of the auxiliary pattern, the auxiliary pattern may be a first auxiliary pattern that is independently formed to maintain the first distance D1 from the second pattern which has a width W1. Portions of the first auxiliary pattern can be separated by a distance of (W1+2×D1). The first auxiliary pattern can be separated the first distance D1 from the second pattern along a perimeter of the second pattern that is linear. The first auxiliary pattern can have a width W2 that is the same as a width W1 of the second pattern. In the forming of the auxiliary pattern, the auxiliary pattern may be a second auxiliary pattern attached to the first pattern and maintaining the first distance D1 from the first pattern. The second auxiliary pattern can be separated the first distance D1 from at least one side of the second pattern that is linear. The second auxiliary pattern can have a width W3 that is less than a width W1 of the second pattern.

The method may further include forming a trimming pattern for removing an unnecessary material between the first and second auxiliary patterns after forming the auxiliary pattern. The unnecessary material removed by the trimming pattern can be a residual material of an etching process.

The method may further include, after the estimating of the fine pattern, checking whether there is a notch in the second pattern; and forming the auxiliary pattern when there is a notch in the second pattern.

According to another aspect of the present invention, there is provided an apparatus for designing a fine pattern. The apparatus includes a reading member reading original data of a fine pattern for exposure. The apparatus also includes a dividing member dividing the fine pattern into a first pattern not requiring revision and a second pattern requiring revision. The apparatus includes a revising member for revising the fine pattern by forming an auxiliary pattern maintaining a first distance D1 from the second pattern. The apparatus includes an estimating member estimating a fine pattern to be transferred onto a target object by running a program including a first auxiliary pattern and a second auxiliary pattern. The apparatus includes a determining member comparing the estimated fine pattern to the original data and designating the revised fine pattern as a final fine pattern if there is no difference between the estimated fine pattern and the original data of the fine pattern for exposure.

In one embodiment, in the forming of the auxiliary pattern, the auxiliary pattern includes a first auxiliary pattern that is independently formed to maintain the first distance D1 from the second pattern which has a width W1.

In one embodiment, in the forming of the auxiliary pattern, the auxiliary pattern includes a second auxiliary pattern attached to the first pattern and separated by the first distance D1 from the first pattern.

In one embodiment, the apparatus further comprises a member forming a trimming pattern formed to aid removal of an unnecessary material that forms between the first and the second auxiliary patterns, after the forming of the auxiliary pattern.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which exemplary embodiments of the invention are shown.

Embodiments of the present invention provide methods and apparatuses for designing fine patterns using computer programs. That is, in order to apply the design layout drawn up by the initial designer to the actual manufacturing process, the layout is revised using a program. Therefore, in embodiments of the present invention, when fine pattern data for exposure drawn up by the initial designer is applied to the manufacturing process, new patterns are added to prevent defects that may arise. These added patterns appear as results on a screen of a display device. Fine patterns to be described below can be divided into patterns that do not need to be separated, patterns that need to be separated, first patterns that do not need additional patterns added around them, and second patterns that need additional patterns added around them. Patterns that require separation may be designated by different names depending on the process they are in.

Figure 1:
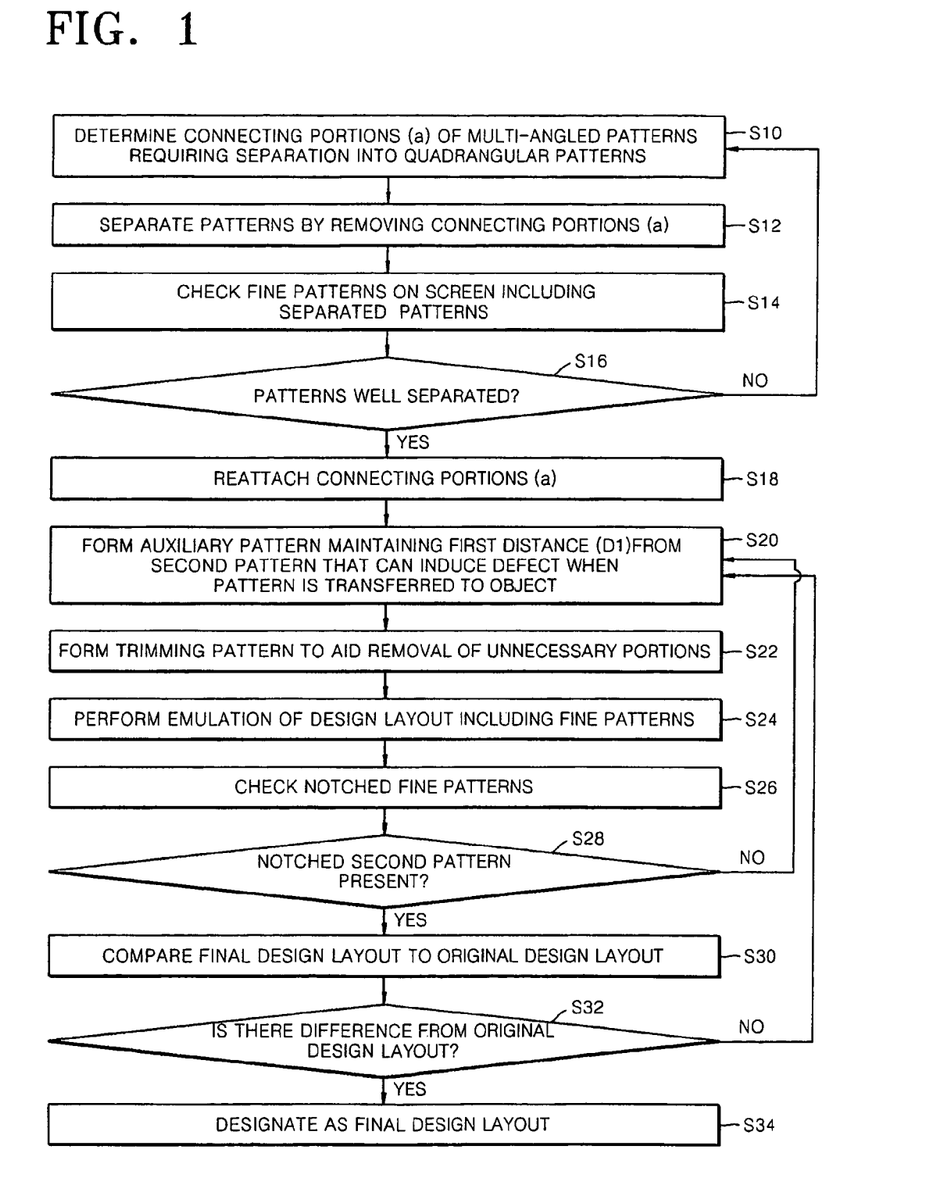
FIG. 1 is a flowchart of a method of designing a fine pattern according to an embodiment of the present invention.

FIG. 1 is a flowchart of a method for designing a fine pattern according to an embodiment of the present invention, and FIGS. 2A through 2I are schematic plan views illustrating the method of FIG. 1. Here, the fine patterns described are mostly line patterns.

Figure 2A:
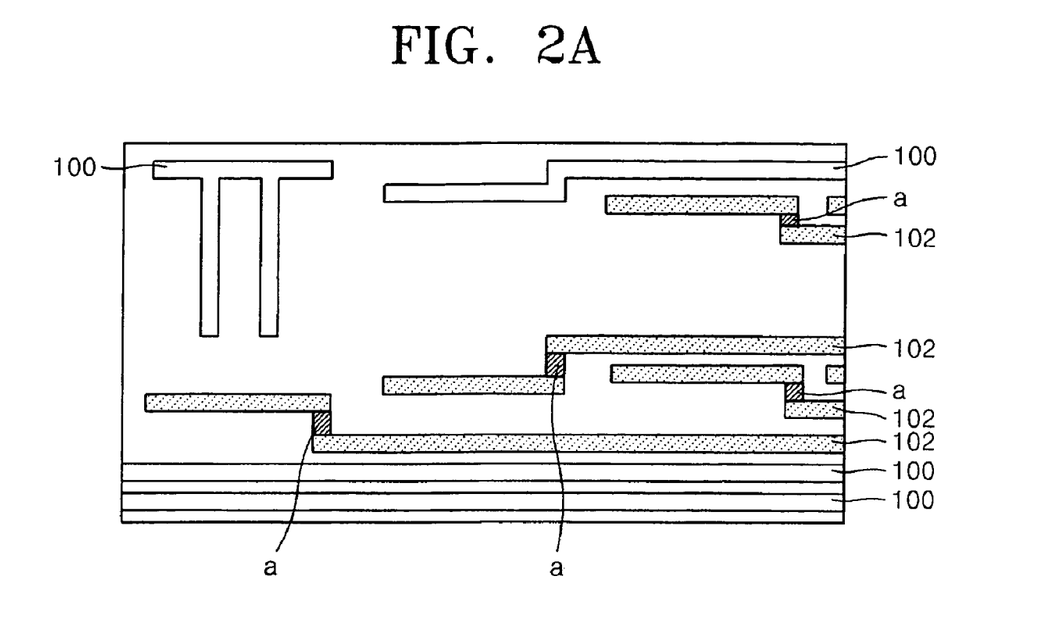
FIGS. 2A through 2H are plan views and FIG. 2I is a block diagram illustrating the process in FIG. 1.

Referring to FIGS. 1 and 2A, data of a fine pattern (hereinafter called "original layout") to be exposed that is drawn up by an initial designer is read. Then, a fine pattern not requiring separation 100 and a fine pattern requiring separation 102 are determined. Here, a fine pattern requiring separation 102 is a multi-angled pattern that has four or more angles. The separation of the fine pattern 102 involves separating the multi-angled pattern into a plurality of quadrangular shapes. For this separation, a connecting portion (a) is selected in operation S10 to separate the multi-angled fine pattern 102 requiring separation into quadrangular shapes. The connecting portion (a) is disposed at the bent portions of the multi-angled pattern, and are removed, thereby separating the pattern into a plurality of quadrangular shapes.

Figure 2B:
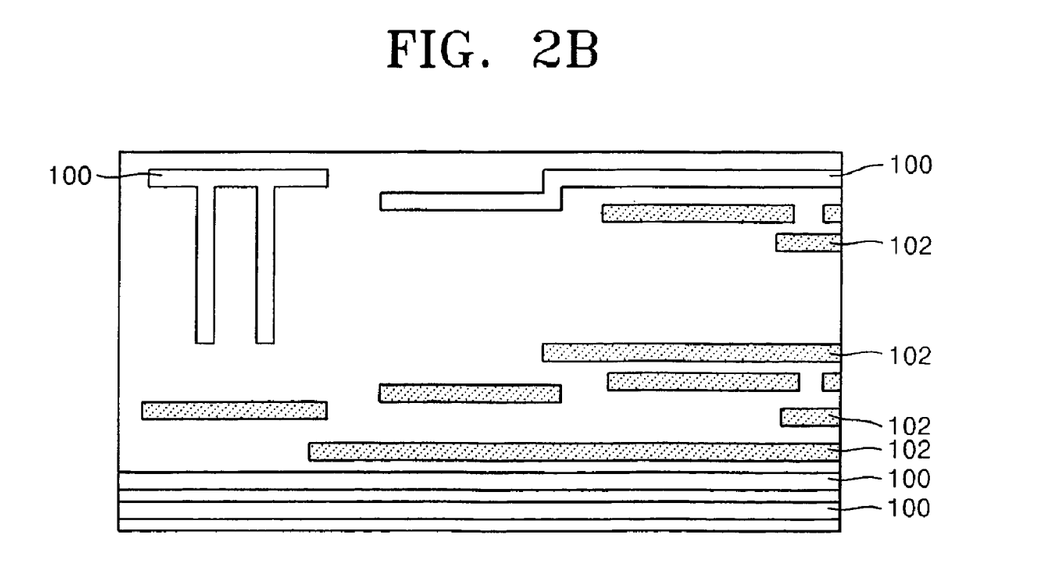
Figure 2C:
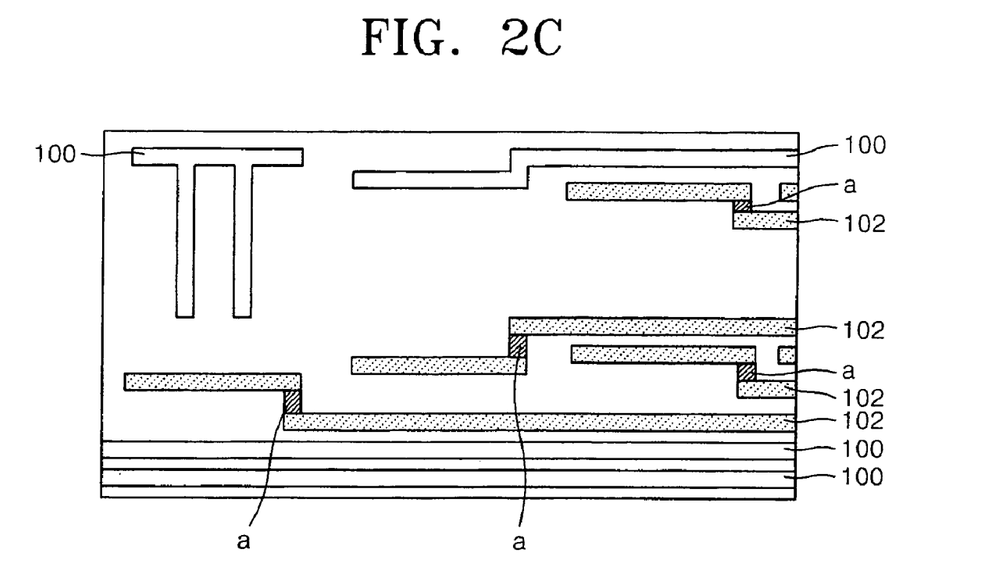

Referring to FIGS. 1 and 2B, the fine pattern 102 is separated by removing the connecting portion (a) in operation S12. The reason for separating the multi-angled fine pattern 102 is to change the shape of the multi-angled pattern into simple, quadrangular shapes (hereinafter, also referred to as separated patterns 102), so that data on the fine patterns is simplified. Here, the simplification involves removing the data on the connecting portion (a), and simplify the data on the pattern form. If the pattern is not separated when designing a fine pattern, a problem of not being able to discard the data on the connector (a) arises. Thus, the data on the fine pattern may be simplified by separating the fine pattern 102.

Here, the separated patterns 102 are divided into a first pattern that does not require revision and a second pattern that requires revision. The second pattern may be a pattern not requiring separation or may be a portion or all of the separated pattern 102.

Next, a fine pattern that includes the separated patterns 102 is checked on the screen in operation S14. That is, it is determined whether the separated pattern 102 has been properly separated, and whether it is a pattern that can be formed through photo etching. This is because the separated pattern 102 cannot be formed on a mask if the separated pattern 102 cannot be formed through photo etching. In operation S16, if a pattern that cannot be formed through photo etching exists, the process returns to operation S10, so any further connecting portions (a) can be selected and addressed in operation.

Also, it is determined if any portions of the fine pattern 102 requiring separation have been omitted or if there is an unnecessary pattern that has been added. Here, the addition of an unnecessary pattern can be determined by comparing the data to the original data. If a pattern has been omitted or if there has been an unnecessary pattern added, it is revised, and the operation shown in FIG. 2A is repeated.

Optionally, even if a multi-angled fine pattern 102 exists, when the fine pattern forming process (for example, double patterning using a self-align method) is performed, the first and second patterns are separated by a thickness of an oxide layer. In this case, there is no need to separate the removed connecting portion (a) shown in FIG. 2C. Here, the connecting portion (a) is reattached in operation S18. That is, according to the manufacturing method of the fine pattern, the connecting portion (a) may not be reattached and the subsequent processes may be performed with the pattern separated. Here, a description will be given with reference to the connecting portion (a) reattached.

Figure 2D:
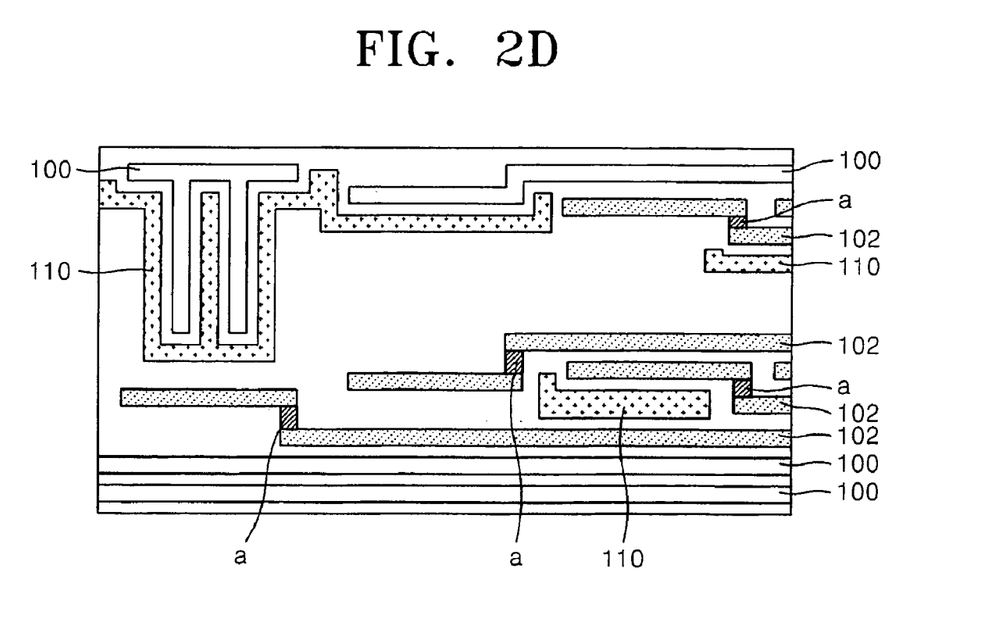

Referring to FIGS. 1 and 2D, when a pattern is transferred to a target object, a first auxiliary pattern 110 that is maintained a first distance D1 from the second pattern that can give rise to defects is formed in operation S20. Here, the second pattern may be a portion or all of the pattern 100 that does not need to be separated and the pattern 102 that is separated in FIG. 2A. For example, the entirety of the protruding portion of the pattern 100 in the upper left-hand side of the screen, and a portion of the separated pattern 102 at the upper right-hand side, are portions which constitute portions of the second pattern requiring revision.

The first auxiliary pattern 110 that is a first distance D1 from the second pattern, may have a width W2, and may be independently disposed. The first auxiliary pattern 110 may be spaced the first distance D1 around the perimeter of the second pattern. Also, the width W2 of the first auxiliary pattern 110 may be equal to a width W1 of the second pattern. The first auxiliary pattern 110 forms between adjacent portions thereof that is greater than or equal to the sum of the width W2 of the first auxiliary pattern 110 and twice the distance of the first distance D1, i.e., (W2+2×D1).

Figure 2E:
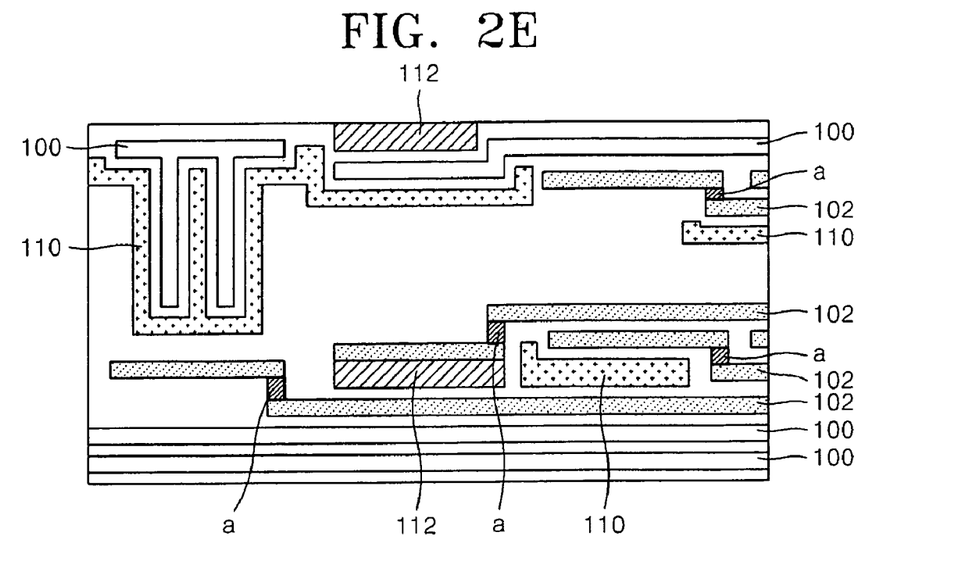

Referring to FIGS. 1 and 2E, when a pattern is transferred onto the target object, a second auxiliary pattern 112, that is maintained the first distance D1 from the second pattern that can cause a defect, is formed in operation S20. Here, the second pattern may be a portion or all of the pattern 100 that does not need to be separated and the separated pattern 102 in FIG. 2A. The second auxiliary pattern 112 may be attached to the first and second patterns in order to be maintained the first distance D1 from the second pattern. The second auxiliary pattern 112 is formed when a gap between a portion of a predetermined fine pattern is greater than the first distance D1 and less than (W2+2×D1). The second auxiliary pattern has a width W3 that is less than a width W1 of the second pattern.

Figure 2F:
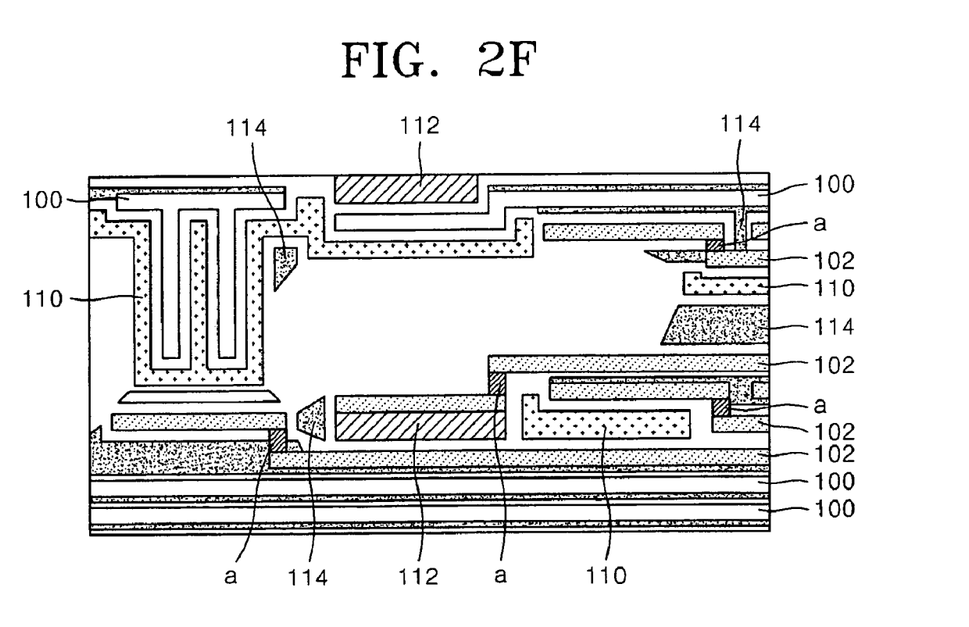

Optionally, as illustrated in FIGS. 1 and 2F, in operation S22, a trimming pattern 114 is formed to aid in removal of unnecessary portions that are anticipated to be removed during the patterning process of the target object, for example, in the etching process. For example, in the case of self-align double patterning, in order to remove unnecessary portions that are deposited in wet etching from polysilicon deposited between oxide layers, the trimming pattern 114 identifies portions to be removed by another wet etching process.

Figure 2G:
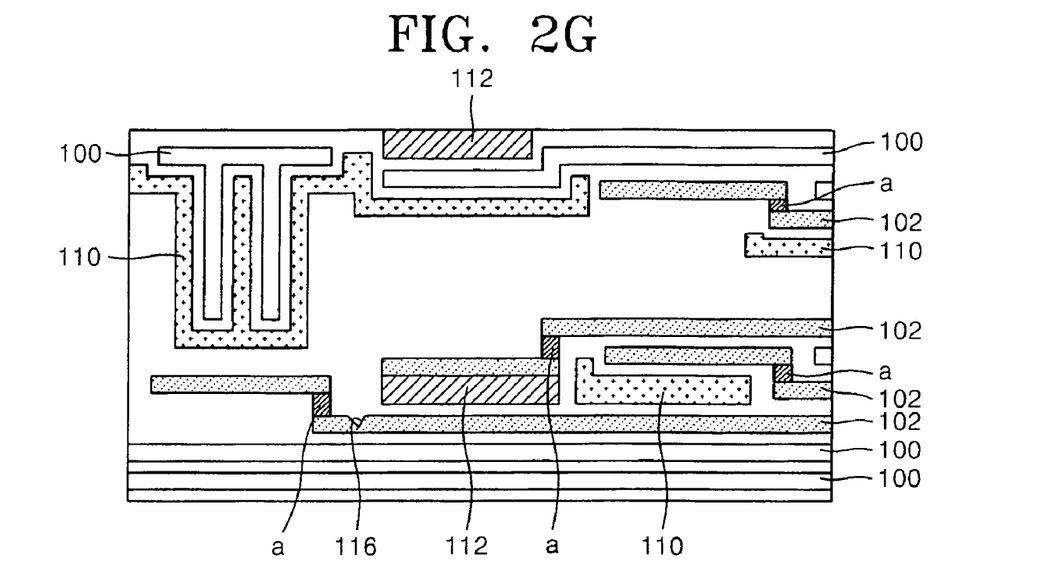

Referring to FIGS. 1 and 2G, in order to check if a design layout that includes the fine patterns of the first pattern, the second pattern, and the auxiliary patterns, and which also may selectively include the connecting portion (a) and the trimming pattern, an emulation of a routine program is performed in operation S24. As illustrated in FIG. 2G, a notch 116 may be formed in the fine pattern. The notch 116 in the fine pattern on the screen is formed to be smaller or finer than in the original design layout.

Figure 2H:
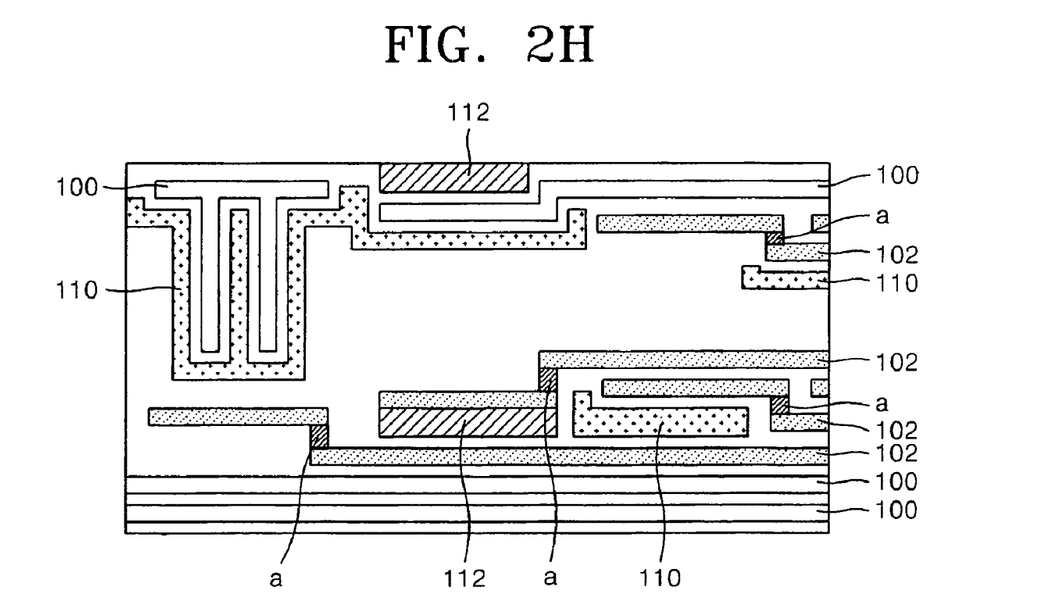

Accordingly, the notches 116 of the fine pattern are checked in operation S26. If there are notches 116, the operation of forming the auxiliary pattern illustrated in FIGS. 2D and 2E is performed again in operation S28. Finally, the final design layout is completed by removing the notches 116, as illustrated in FIG. 2H.

Figure 2I:
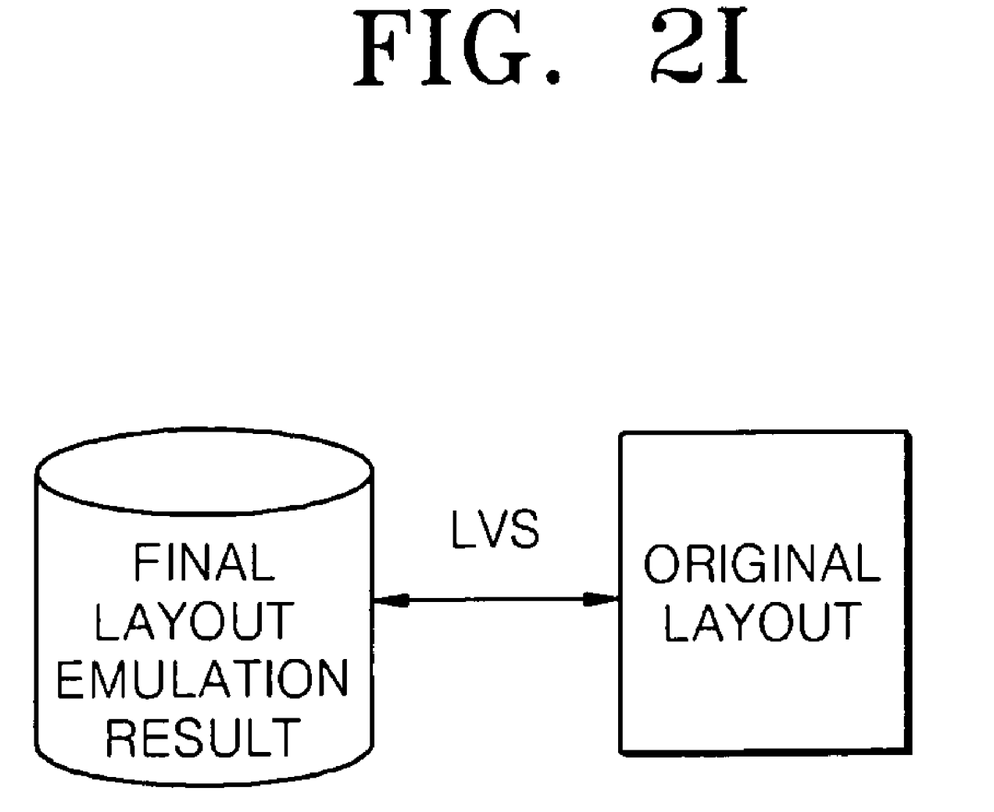

Referring to FIGS. 1 and 2I, the completed final design layout is compared to the original design layout in operation S30. If needed, a check, such as a design rule check, may be performed. If the final design layout is the same as the original design layout with the exception of the added pattern elements, the layout is designated as the final design layout in operation S34. In operation S32, if the original design layout is different from the final design layout, the processes from forming the auxiliary pattern of operation S20 are repeated.

Figure 3:
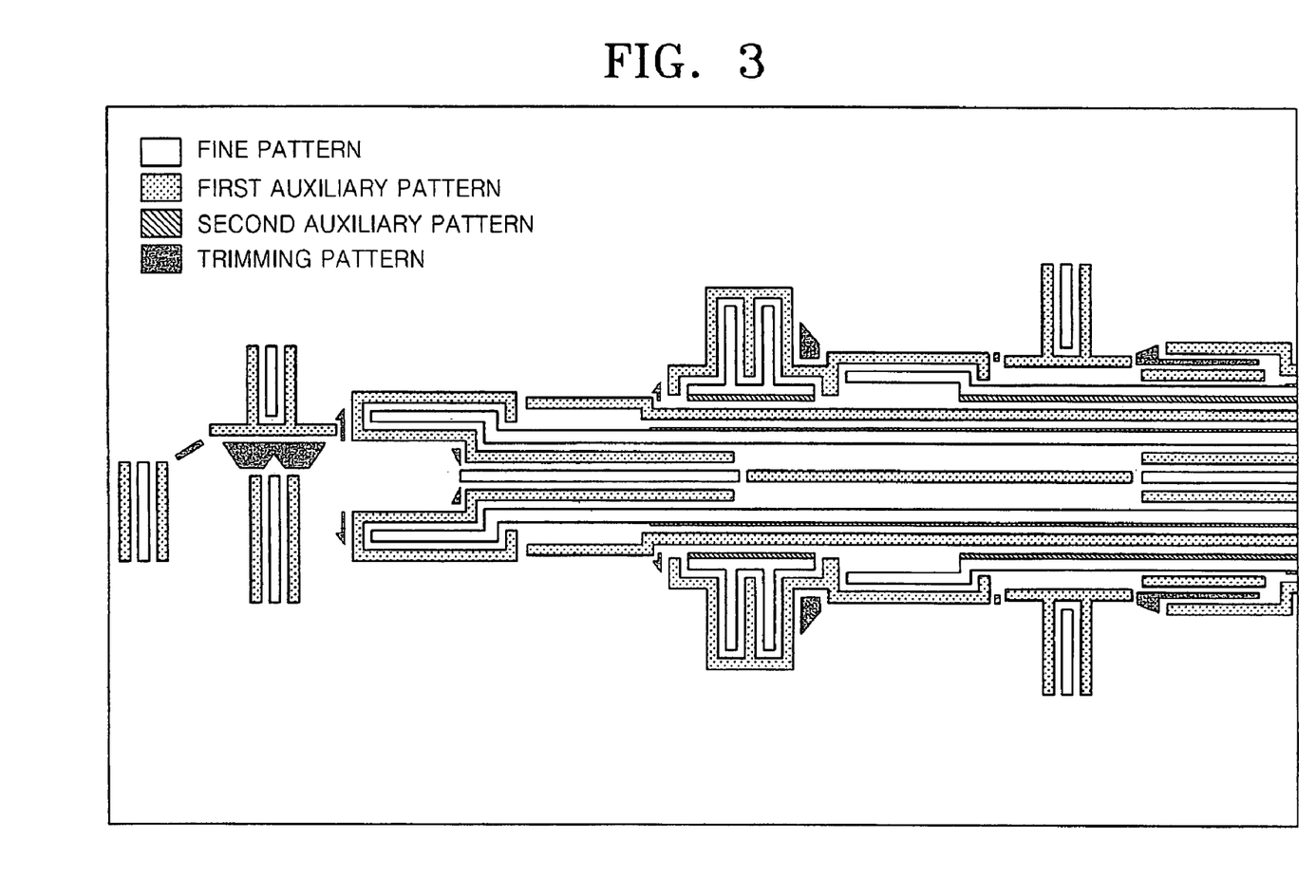
FIG. 3 is a plan view illustrating a design layout of a fine pattern designed according to the present invention.

FIG. 3 is a plan view illustrating a design layout of a fine pattern designed according to the present invention. Here, unfilled regions are fine patterns of the present invention, regions filled with crossed patterns are the first auxiliary pattern, regions shaded with oblique lines are the second auxiliary pattern, and darkly shaded regions are the trimming pattern of the present invention. The first auxiliary pattern is spaced the first distance D1 from the corresponding portion of the fine pattern, and the second auxiliary pattern is attached to a corresponding portion of the fine pattern and maintains the first distance D1 with another portion of the fine pattern.

In the present invention, with the presence of an auxiliary pattern, a fine pattern can be prevented from not transferring onto a target object, and a trimming pattern can remove unnecessary portions that can arise during the manufacturing process. Moreover, when the original design layout is applied to the actual manufacturing process, unsatisfactory portions can be reinforced.

The method and apparatus for designing a fine pattern according to the present invention as described above, forms an auxiliary pattern for effectively transferring a fine pattern for exposing, so that a design can be made for a fine pattern that transfers completely to a target object.

Also, by adding a trimming pattern for removing portions that are anticipated to be removed in the manufacturing stages, a corresponding manufacturing process can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of designing a fine pattern, comprising:
reading original data of a fine pattern for exposure;
dividing the fine pattern into a first pattern not requiring revision and a second pattern requiring revision;
correcting the fine pattern by forming an auxiliary pattern maintaining a first distance D1 from the second pattern such that a revised fine pattern is formed;
estimating a fine pattern to be transferred to a target object by running an emulation program using an emulating device for emulation of the revised fine pattern including the auxiliary pattern; and
comparing the estimated fine pattern to the original data of the fine pattern for exposure, and designating the revised fine pattern as a final fine pattern if there is no difference between the estimated fine pattern and the original data of the fine pattern for exposure.

2. The method of claim 1, wherein the dividing the fine pattern comprises:
selecting from a plurality of multi-angled fine patterns a selected multi-angled fine pattern to be divided into the first and second patterns;
determining a connecting portion for dividing the selected multi-angled fine pattern into quadrangular shapes; and
obtaining the divided first and second patterns by removing the connecting portion.

3. The method of claim 2, further comprising, after the dividing the fine pattern, checking whether the dividing the fine pattern into the first and second patterns has been properly performed; and
reselecting the multi-angled fine pattern to be divided into the first and second patterns if the dividing the fine pattern into the first and second patterns has not been properly performed.

4. The method of claim 2, further comprising, after the dividing the fine pattern into the first and second patterns:
checking whether the dividing the fine pattern into the first and second patterns has been properly performed; and
reattaching the connecting portion if the dividing has been properly performed.

5. The method of claim 2, further comprising, after the dividing the fine pattern into the first and second patterns:
determining whether the first and second patterns obtained can be formed through photo etching; and
reselecting a multi-angled fine pattern to be divided into the first and second patterns if it is determined that the first and second patterns obtained cannot be formed through the photo etching.

6. The method of claim 1, wherein, in the forming an auxiliary pattern, the auxiliary pattern includes a first auxiliary pattern that is independently formed to maintain the first distance D1 from the second pattern which has a width W1.

7. The method of claim 6, wherein portions of the first auxiliary pattern are separated by a distance of (W1+2×D1).

8. The method of claim 6, wherein the first auxiliary pattern is separated by the first distance D1 from the second pattern along a perimeter of the second pattern that is linear.

9. The method of claim 6, wherein the first auxiliary pattern has a width W2 that is the same as the width W1 of the second pattern.

10. The method of claim 1, wherein, in the forming an auxiliary pattern, the auxiliary pattern includes a second auxiliary pattern attached to the first pattern and maintaining the first distance D1 from the first pattern.

11. The method of claim 10, wherein the second auxiliary pattern is separated by the first distance D1 from at least one side of the second pattern that is linear.

12. The method of claim 10, wherein the second auxiliary pattern has a width W3 that is less than a width W1 of the second pattern.

13. The method of claim 1, further comprising forming a trimming pattern for removing an unnecessary material between first and second auxiliary patterns after the forming an auxiliary pattern, wherein, in the forming an auxiliary pattern, the auxiliary pattern includes the first auxiliary pattern and the second auxiliary pattern.

14. The method of claim 13, wherein the unnecessary material removed by the trimming pattern is a residual material of an etching process.

15. The method of claim 13, after the estimating a fine pattern, further comprising:
   checking whether there is a notch in the second pattern; and
   reforming the auxiliary pattern if there is a notch in the second pattern.

16. An apparatus for designing a fine pattern, comprising:
   a reading member for reading original data of a fine pattern for exposure;
   a dividing member for dividing the fine pattern into a first pattern not requiring revision and a second pattern requiring revision;
   a revising member for revising the fine pattern by forming an auxiliary pattern maintaining a first distance D1 from the second pattern such that a revised fine pattern is formed;
   an estimating member for estimating a fine pattern to be transferred to a target object by running a program for emulation of the revised fine pattern including the auxiliary pattern; and
   a determining member for comparing the estimated fine pattern to the original data, and designating the revised fine pattern as a final fine pattern if there is no difference between the estimated fine pattern and the original data of the fine pattern for exposure.

17. The apparatus of claim 16, wherein, in the forming an auxiliary pattern, the auxiliary pattern includes a first auxiliary pattern that is independently formed to maintain the first distance D1 from the second pattern which has a width W1.

18. The apparatus of claim 16, wherein, in the forming an auxiliary pattern, the auxiliary pattern includes a second auxiliary pattern attached to the first pattern and separated by the first distance D1 from the first pattern.

19. The apparatus of claim 16, further comprising a member for forming a trimming pattern to aid removal of an unnecessary material formed between first and the second auxiliary patterns, after the forming an auxiliary pattern, wherein the auxiliary pattern includes the first auxiliary pattern and the second auxiliary pattern.

* * * * *